(12) United States Patent
Ball et al.

(10) Patent No.: US 7,527,506 B2
(45) Date of Patent: May 5, 2009

(54) EMI SHIELDING/ELECTRICAL GROUNDING MEMBERS

(75) Inventors: Shelby Ball, Frisco, TX (US); Karl Hamand, Round Rock, TX (US)

(73) Assignees: Laird Technologies, Inc., Chesterfield, MO (US); Dell Products L.P., Round Rock, TX (US)

( * ) Notice: Subject to any disclaimer, the term of this patent is extended or adjusted under 35 U.S.C. 154(b) by 0 days.

(21) Appl. No.: 11/968,333

(22) Filed: Jan. 2, 2008

(65) Prior Publication Data

US 2009/0061683 A1 Mar. 5, 2009

Related U.S. Application Data

(60) Provisional application No. 60/983,853, filed on Oct. 30, 2007, provisional application No. 60/969,397, filed on Aug. 31, 2007.

(51) Int. Cl.
*H01R 4/66* (2006.01)
(52) U.S. Cl. ........................................ 439/92
(58) Field of Classification Search ......... 439/607–609, 439/92; 361/800, 816, 818; 174/377, 384, 174/387; 29/594
See application file for complete search history.

(56) References Cited

U.S. PATENT DOCUMENTS

| | | | |
|---|---|---|---|
| 5,029,254 A | 7/1991 | Stickney | |
| 5,513,996 A | 5/1996 | Annerino et al. | |
| 6,064,509 A | 5/2000 | Tonar et al. | |
| 6,283,770 B1 | 9/2001 | Leung et al. | |
| 6,320,120 B1 | 11/2001 | Van Haaster | |
| 7,044,753 B2 | 5/2006 | Schaffer et al. | |
| 7,259,969 B2 * | 8/2007 | Zarganis et al. | 361/800 |
| 7,412,163 B2 * | 8/2008 | Wu | 396/429 |
| 2001/0022230 A1 | 9/2001 | Kaplo | |
| 2003/0086663 A1 | 5/2003 | Brezina et al. | |
| 2003/0160396 A1 | 8/2003 | Dean | |
| 2006/0012969 A1 | 1/2006 | Bachman | |
| 2006/0134982 A1 | 6/2006 | Zarganis et al. | |
| 2006/0157273 A1 | 7/2006 | White | |

* cited by examiner

*Primary Examiner*—Jean F Duverne
(74) *Attorney, Agent, or Firm*—Harness, Dickey & Pierce, P.L.C.

(57) ABSTRACT

Exemplary embodiments are provided of EMI shielding/electrical grounding members configured to be installed to a substrate for interposition between electrically-conductive surfaces, for establishing electrical grounding contact from the substrate to the electrically-conductive surfaces. In one exemplary embodiment, an EMI shielding/electrical grounding member generally includes first and second generally opposing sides hingedly connected and having respective first and second contact faces configured such that the first and second contact faces are each relatively independently operable and freely compressible upon contact with the respective first and second electrically-conductive surfaces, regardless of whether the other of said first and second contact faces is in contact with the corresponding first or second electrically-conductive surface.

28 Claims, 13 Drawing Sheets

EMI SHIELDING/ELECTRICAL GROUNDING MEMBERS

CROSS-REFERENCE TO RELATED APPLICATIONS

This application claims the benefit of U.S. Provisional Application No. 60/969,397 filed Aug. 31, 2007 and U.S. Provisional Application No. 60/983,853 filed Oct. 30, 2007. The disclosures of the above applications are incorporated herein by reference.

FIELD

The present disclosure generally relates to EMI shielding/electrical grounding members.

BACKGROUND

The statements in this section merely provide background information related to the present disclosure and may not constitute prior art.

Selected electronic parts radiate electromagnetic waves, which can cause noise or unwanted signals to appear in electronic devices existing within a certain proximity of the radiating parts. Accordingly, it is not uncommon to provide electrical grounding for electronic components that use circuitry that emits or is susceptible to electromagnetic radiation, to thereby allow offending electrical charges and fields to be dissipated without disrupting operation of the electronic components.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding.

SUMMARY

According to various aspects, exemplary embodiments are provided of EMI shielding/electrical grounding members configured to be installed to a substrate for interposition between electrically-conductive surfaces, for establishing electrical grounding contact from the substrate to the electrically-conductive surfaces. In one exemplary embodiment, an EMI shielding/electrical grounding member generally includes first and second generally opposing sides hingedly connected and having respective first and second contact faces configured such that the first and second contact faces are each relatively independently operable and freely compressible upon contact with the respective first and second electrically-conductive surfaces, regardless of whether the other of said first and second contact faces is in contact with the corresponding first or second electrically-conductive surface.

In another exemplary embodiment, an EMI shielding/electrical grounding member generally includes a generally longitudinally extending region. One or more slots extend generally transversely along the generally longitudinally extending region. First and second resiliently flexible finger elements are defined by the slots along respective first and second sides of the EMI shielding/electrical grounding member such that the first and second resiliently flexible finger elements are relatively independently operable and freely compressible upon contact with the respective first and second electrically-conductive surfaces, regardless of whether the other of said first and second resiliently flexible finger elements is in contact with the corresponding first or second electrically-conductive surface. Contact between the first resiliently flexible finger element and the first electrically-conductive surface may apply sufficient pressure for causing the first resiliently flexible finger element to compressively flex generally inwardly towards the substrate, against a force resiliently biasing the first resiliently flexible finger element in a generally outward direction from the substrate towards the first electrically-conductive surface. Contact between the second resiliently flexible finger element and the second electrically-conductive surface may apply sufficient pressure for causing the second resiliently flexible finger element to compressively flex generally inwardly towards the substrate, against a force resiliently biasing the second resiliently flexible finger element in a generally outward direction from the substrate towards the second electrically-conductive surface.

Additional aspects provide methods relating to EMI shielding/electrical grounding members, such as methods for establishing electrical grounding contact from a substrate to first and second electrically-conductive surfaces. In one exemplary embodiment, a method generally includes installing an EMI shielding/electrical grounding member to the substrate such that generally opposing first and second sides of the EMI shielding/electrical grounding member are positioned for making electrical grounding contact with the respective first and second electrically-conductive surfaces. In this example, the first and second sides of the EMI shielding/electrical grounding member are hingedly connected and have respective first and second contact faces configured such that the first and second contact faces are each relatively independently operable and freely compressible upon contact with the respective first and second electrically-conductive surfaces, regardless of whether the other of said first and second contact faces is in contact with the corresponding first or second electrically-conductive surface.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

Figure 10:
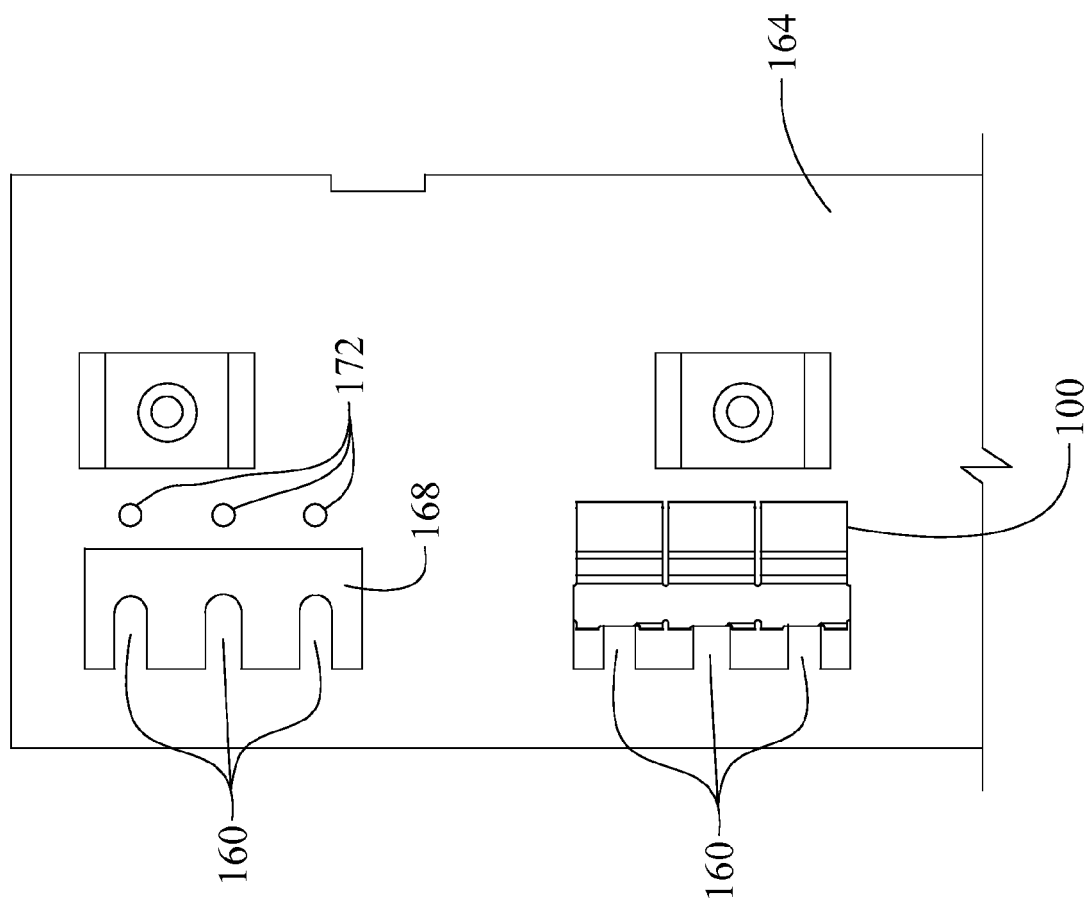
FIG. 10 is a view illustrating the EMI shielding/electrical grounding member shown in FIG. 1 installed on a sheet metal structure according to an exemplary embodiment.
Figure 12:
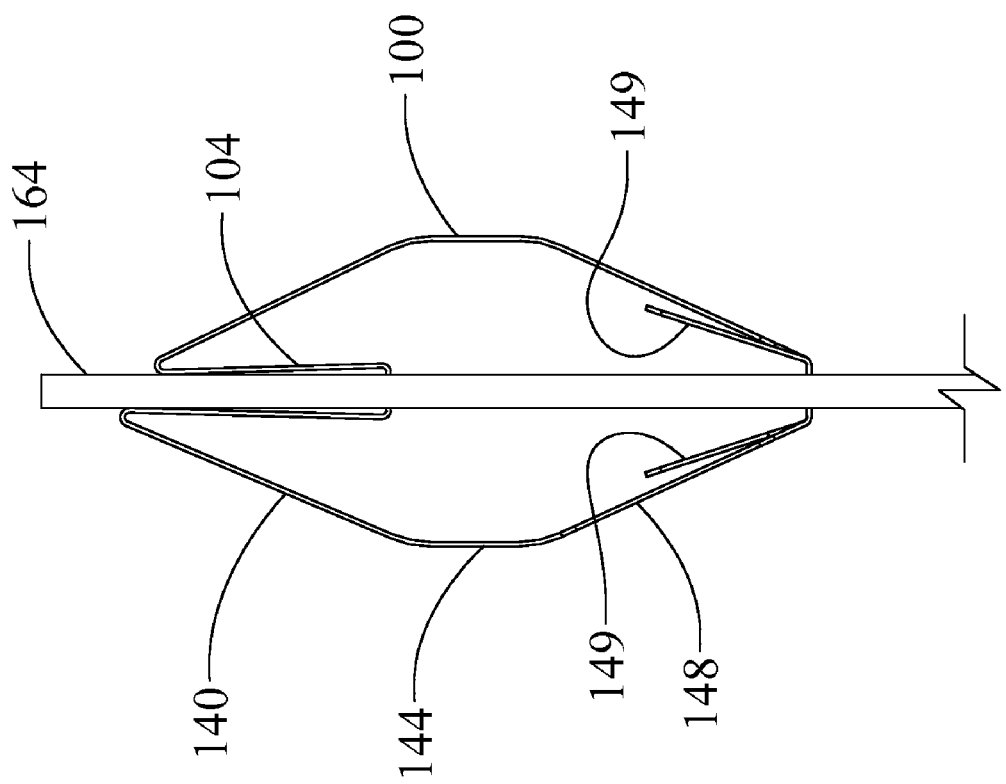
Figure 13:
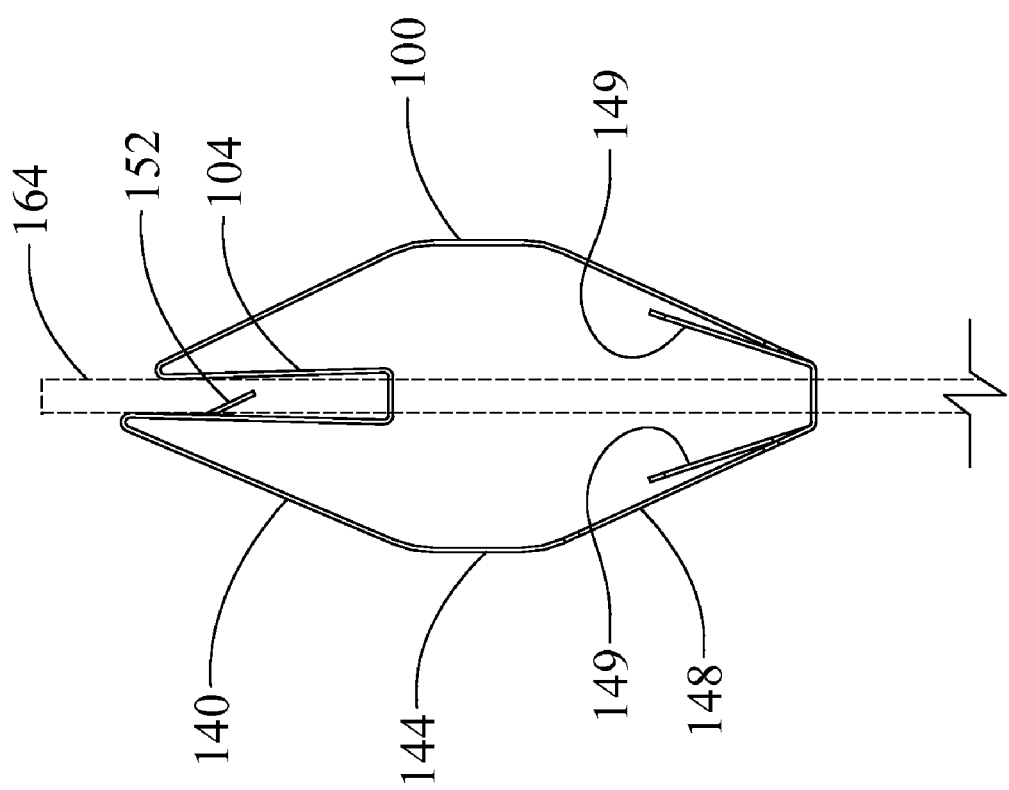

FIG. 12 is an end view of the EMI shielding/electrical grounding member shown in FIG. 10 and illustrating the exemplary attachment of the EMI shielding/electrical grounding member to the sheet metal structure; and FIG. 13 is an end view of the exemplary attachment of the EMI shielding/electrical grounding member to the sheet metal structure shown in FIG. 12 and illustrating portions (e.g., D-shaped lance features, etc.) of the EMI shielding/electrical grounding member shown in solid lines, which would otherwise be hidden.

DETAILED DESCRIPTION

The following description is merely exemplary in nature and is in no way intended to limit the present disclosure, application, or uses. It should be understood that throughout the drawings, corresponding reference numerals indicate like or corresponding parts and features.

Accordingly, various embodiments provide EMI shielding/electrical grounding members that may be relatively easily installed manually onto a substrate or mounting surface (e.g., sheet metal structure, etc.). Once installed, the EMI shielding/electrical grounding members may provide good electrical grounding contact between the substrate and adjacent electrically-conductive surfaces. For example, an EMI shielding/electrical grounding member disclosed herein may be installed onto a sheet metal structure, whereby each side of the EMI shielding/electrical grounding member may be inwardly flexed or compressed by an adjacent electrically-conductive surface, and without effecting the functioning of the opposite side. This, in turn, allows one EMI shielding/electrical grounding members to be used for both sides of the substrate for establishing electrical grounding with two adjacent electrically-conductive surfaces, as compared to some installations that require a grounding member on each side.

In one exemplary installation, an EMI shielding/electrical grounding member disclosed herein may be used in conjunction with self-contained computer servers, also commonly referred to as blade servers. In this example, the EMI shielding/electrical grounding member may be installed onto a wall of an enclosure or support structure (e.g., FIGS. 10 through 13, etc.) between two blade servers slidably positioned within the enclosure/support structure. Advantageously, each blade server may be slid in and out relative to the other blade server and wall (on which the EMI shielding/electrical grounding member is installed) without effecting or applying force to the opposing side of the EMI shielding/electrical grounding member. Thus, the EMI shielding/electrical grounding member may still provide an electrical grounding path from the wall to the second blade server even after the first blade server has been slidably removed. Accordingly electrical grounding may be accomplished along both sides of a substrate to two servers (or electrically-conductive surfaces) between which the substrate is disposed by using a single EMI shielding/electrical grounding member for both substrate sides, rather than using an EMI shielding/electrical grounding member for each side. In some exemplary installations, however, more than one EMI shielding/electrical grounding member may be used, such as that shown in FIG. 10 where one EMI shielding/electrical grounding member 100 is installed but there is an opening 168 for receiving a second EMI shielding/electrical grounding member 100, if deemed necessary.

In some exemplary embodiments, the EMI shielding/electrical grounding member includes a generally u-shaped channel along one end thereof that is configured to frictionally grip a corresponding portion of a substrate (e.g., sheet metal structure, etc.) therein. Along its other end, the EMI shielding/electrical grounding member may include one or more openings for engagingly receiving corresponding portions (e.g., projections, protuberances, elongate members tangs, tongues, prongs, etc.) of the substrate. Within the u-shaped channel, the EMI shielding/electrical grounding member may include one or more D-shaped lance features that are configured for helping the EMI shielding/electrical grounding member remain installed to the substrate. In some embodiments, the one or more D-shaped lance features may be engagingly received within openings defined by the substrate. Or, for example, the one or more D-shaped lance features may abut against a solid surface portion of the substrate. In either case, the engagement of the D-shaped lance features with the substrate can thus provide a relatively secure mechanical attachment that inhibits the EMI shielding/electrical grounding member from inadvertently falling out, which might otherwise cause an electrical short on an adjacent printed circuit board and/or reduce the EMI shielding.

FIGS. 1 through 7 illustrate an exemplary EMI shielding/electrical grounding member 100 embodying one or more aspects of the present disclosure. The EMI shielding/electrical grounding member 100 may be configured to be installed to a substrate for interposition between electrically-conductive surfaces, for establishing electrical grounding contact from the substrate to the electrically-conductive surfaces. As shown in FIGS. 1 through 7, the EMI shielding/electrical grounding member 100 includes a generally longitudinally extending region 102, a channel 104, and finger elements 108.

The channel 104 extends generally longitudinally along the EMI shielding/electrical grounding member 100. In this particular illustrated embodiment, the channel 104 is discontinuous in that the channel 104 includes channel portions separated by openings defined at the ends of the slots 112. Alternative embodiments may include a single continuous channel. In either case, the channel(s) are preferably configured to engagingly receive a portion of a substrate (e.g., sheet metal, etc.) for helping to mechanically retain the EMI shielding/electrical grounding member 100 to the substrate.

Figure 7:
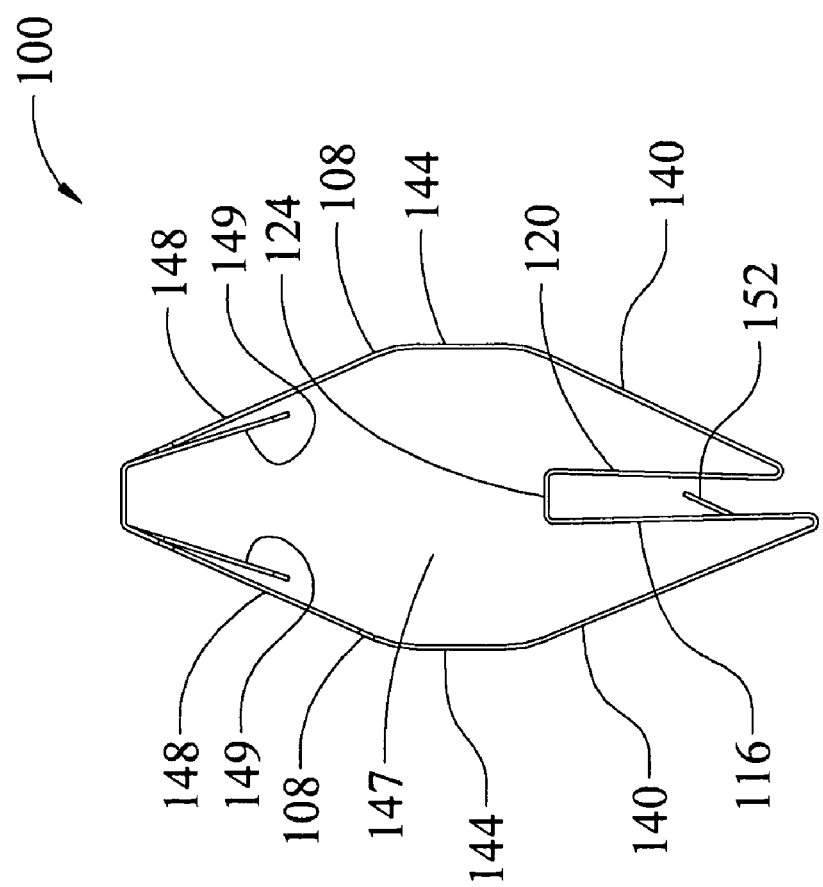
FIG. 7 is an end elevation view of the EMI shielding/electrical grounding member shown in FIG. 1.

As shown in FIG. 7, the channel 104 includes first and second generally opposing sidewall portions 116, 120 connected by a third wall portion 124. The first, second, and third wall portions or legs 116, 120, 124 cooperatively define a generally inverted U-shaped or C-shaped cross-section or transverse profile for the channel 104. Alternative embodiments may have channels with different transverse profiles than what is shown in the figures depending, for example, at least in part on the particular substrate to which the EMI shielding/electrical grounding member will be installed and desired clamping force and electrical contact to be produced by the EMI shielding/electrical grounding member.

The channel 104 may be configured for frictionally engaging a portion of substrate received within the channel 104. For example, FIGS. 13 and 14 illustrate a portion of a substrate 164 that has been received within the channel 104. To position the portion of the substrate 164 into the channel 104, the EMI shielding/electrical grounding member 100 may be inserted or positioned into an opening 168 (FIG. 10) of the substrate 164.

The channel's wall portions 116, 120 may be configured for squeezing the opposite surfaces of the substrate portion received within the channel 104. In some embodiments, the sidewall portions 116, 120 may be resiliently biased inwardly (or configured otherwise) to create a flexible tension grip applied by the sidewall portions 116, 120 to the substrate portion sufficient for inhibiting inadvertent removal of the EMI shielding/electrical grounding member 100 from the substrate during normal use, such as when a blade server (or other electronic equipment or devices) is slidably moved relative to the substrate.

A gap may be provided between the sidewall portions 116, 120 that is less than the thickness of the substrate onto which the EMI shielding/electrical grounding member 100 will be installed. Accordingly, positioning a substrate portion between the sidewall portions 116, 120 into the gap causes the sidewall portions 116, 120 to separate slightly. Due to the resilience of the material(s) from which the sidewall portions 116, 120 are preferably made, the sidewall portions 116, 120 may then spring back and press against the substrate. Accordingly, this allows the EMI shielding/electrical grounding member 100 to be readily easily and quickly installed ("clip or snap into place") onto a substrate without requiring the use of mechanical fasteners. This feature can also allow for ready and easy removal of the EMI shielding/electrical grounding member 100 from the substrate. The channel 104 is preferably configured to allow the EMI shielding/electrical grounding member 100 to be clipped onto and installed to a substrate with relatively low force.

In the illustrated embodiment, the sidewall portions 116, 120 are generally straight without any inward or outward slant such that right angles are defined generally between each sidewall portion 116, 120 and the third wall portion 124. In still other embodiments, the sidewall portions 116, 120 may be angled at least slightly inwardly or outwardly such that respective acute or obtuse angles are defined generally between each sidewall portion 116, 120 and the upper wall portion 124. Further embodiments are configured such that the differently-sized angles are defined generally between each sidewall portion 116,120, and the third wall portion 124.

When the EMI shielding/electrical grounding member 100 has been positioned with a portion of a substrate within the channel 104, the EMI shielding/electrical grounding member 100 preferably makes good electrical contact with the substrate. In such embodiments, the sidewall portions 116, 120 may cooperatively generate a sufficient clamping force to mechanically retain the EMI shielding/electrical grounding member 100 to the substrate. The clamping force also preferably creates sufficient contact pressure between the channel's sidewall portions 116, 120 and the substrate to establish good electrical conductivity therebetween.

In various embodiments, the channel 104 is configured (e.g., sized, formed of resilient materials, etc.) to allow the EMI shielding/electrical grounding member 100 to be installed onto a substrate or mounting surface having thicknesses of about 0.026 inches. Alternatively, other EMI shielding/grounding members may have channels configured for installation onto structures or substrates having a thickness more or less than about 0.026 inches. The dimensions provided in this paragraph (as are all dimensions disclosed herein) are for purposes of illustration only and not for purposes of limitation.

Figure 1:
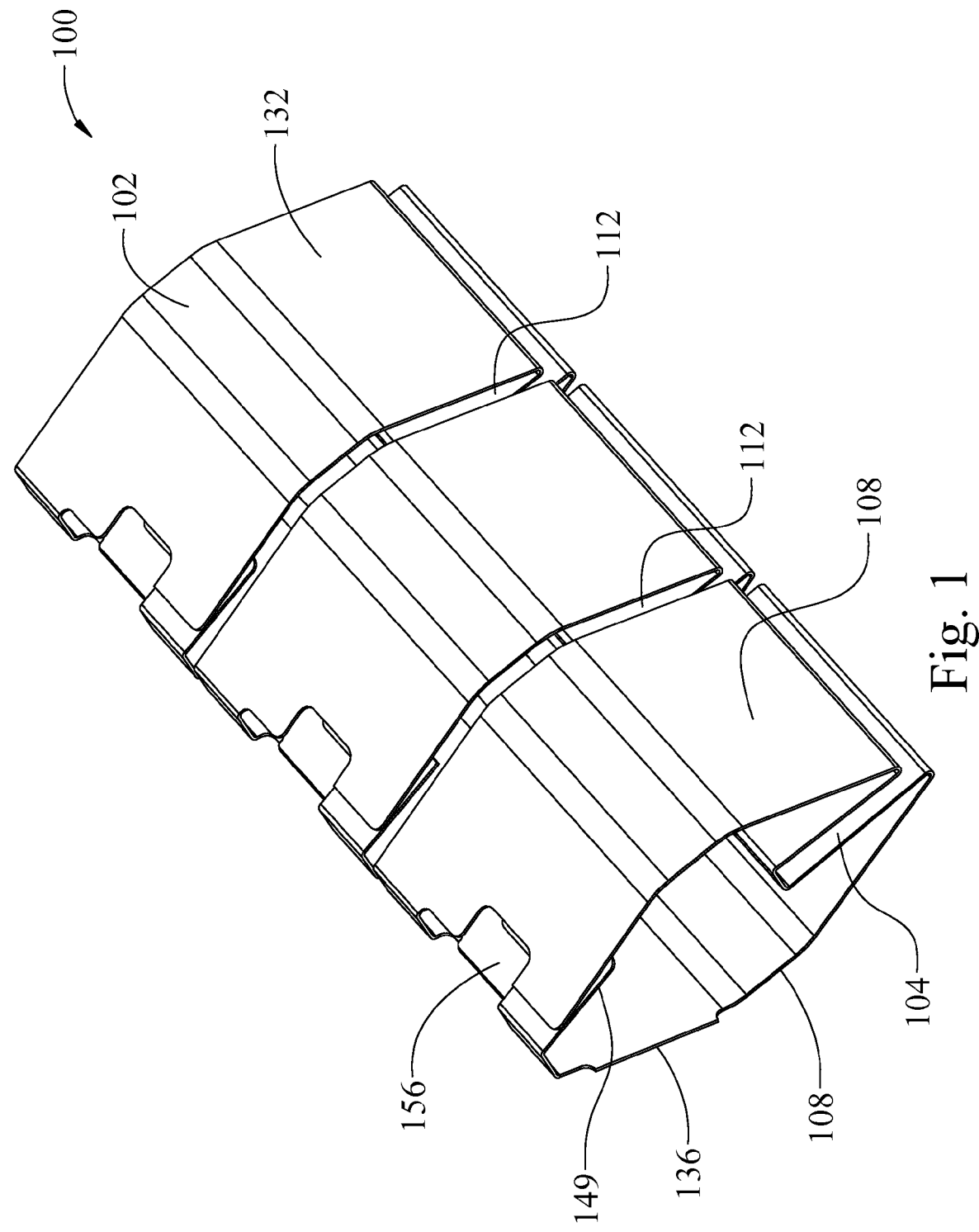
FIG. 1 is a perspective view of an EMI shielding/electrical grounding member according to an exemplary embodiment.
Figure 2:
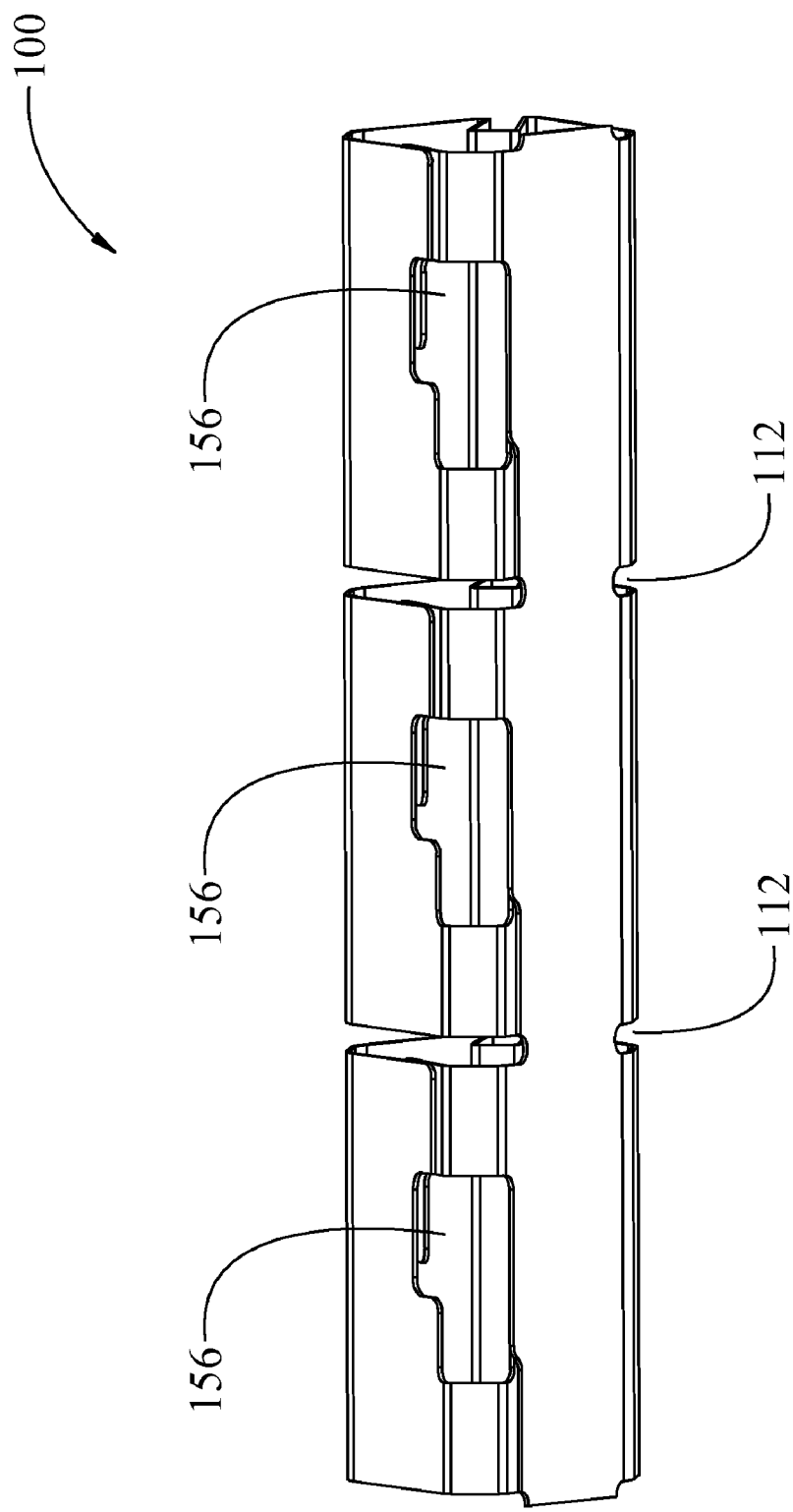
FIG. 2 is another perspective view of the EMI shielding/electrical grounding member shown in FIG. 1.

As shown in FIG. 1, the EMI shielding/electrical grounding member 100 includes slots or slits 112. The slots 112 preferably define the finger elements 108 therebetween such that the finger elements 108 are able to flex relatively independently from one another.

For example, the finger elements 108 along the first side 132 may be caused to move inwardly generally towards the substrate upon contact with and application of pressure thereto by a first electrically-conductive surface, thereby establishing electrical conductivity between the substrate and the first electrically-conductive surface. Similarly, the finger elements 108 along the second side 136 may be caused to move inwardly generally towards the substrate upon contact with and application of pressure thereto by a second electrically-conductive surface, thereby establishing electrical conductivity between the substrate and the second electrically-conductive surface.

The finger elements 108 along the first side 132 may be configured such that they are independently operable from the finger elements 108 along the second side 136. That is, the finger elements 108 along the first side 132 may establish electrical conductivity between the substrate and the first electrically-conductive surface, regardless of whether the finger elements 108 along the second side 136 have been inwardly flexed or compressed and/or are establishing electrical conductivity between the substrate and the second electrically-conductive surface. In some embodiments, inward movement of the finger elements 108 along the first side 132 helps create or adds to a resilient biasing force in a generally outward direction from the substrate to the first electrically-conductive surface. The biasing force may help improve electrical grounding contact between the finger elements 108 along the first side 132 and the first electrically-conductive surface.

Similarly, the finger elements 108 along the second side 136 may be configured such that they are independently operable from the finger elements 108 along the first side 132. That is, the finger elements 108 along the second side 136 may establish electrical conductivity between the substrate and the second electrically-conductive surface, regardless of whether the finger elements 108 along the first side 132 have been inwardly flexed or compressed and/or are establishing electrical conductivity between the substrate and the first electrically-conductive surface. In some embodiments, inward movement of the finger elements 108 along the second side 136 helps create or adds to a resilient biasing force in a generally outward direction from the substrate to the second electrically-conductive surface. The biasing force may help improve electrical grounding contact between the finger elements 108 along the second side 136 and the second electrically-conductive surface.

The particular dimensions of the slots 112 and finger elements 108, as well as the number of slots 112 and finger elements 108 may be varied depending, for example, upon the length of the EMI shielding/electrical grounding member 100, desired shielding effectiveness, material properties of the EMI shielding/electrical grounding member 100, and particular installation (e.g., thickness of the mounting surface, rail, edge, etc. on which the EMI shielding/electrical grounding member 100 will be positioned, etc.). In addition, the dimensions may vary as a function of location such that the EMI shielding/electrical grounding member 100 may be thicker in one region than another. Accordingly, the dimensions of the EMI shielding/electrical grounding member EMI shielding/electrical grounding member may be varied accordingly in order to achieve the desired contact.

With continued reference to FIG. 7, there is shown an exemplary profile for the member 100. As shown, the profile for each finger element 108 includes a first slanted portion 140, a generally flat portion 144, and a second slanted portion 148. The generally flat portion 144 extends from the first slanted portion 140 such that an obtuse angle is defined generally between the first slanted portion 140 and the generally flat portion 144. The second slanted portion 148 extends from the generally flat portion 144 such that an obtuse angle is defined generally therebetween. The first and second slanted portions 140 and 148 may be operable as camming surfaces. For example, a surface sliding along and applying pressure to the camming surface may cause the corresponding finger element to move or flex generally inwardly towards the substrate. In addition, the generally flat portion 144 may also be operable and/or referred to herein as a contact face for making contact with the corresponding electrically-conductive surface. Alternative embodiments may have finger elements with different cross-sections or transverse profiles than what is shown in the figures depending, for example, on the particular installation intended for the EMI shielding/electrical grounding member.

Also shown in FIG. 7, the EMI shielding/electrical grounding member 100 generally defines an interior space 147. The first and second sides 132 and 136 also includes overlapping end portions 149 generally opposite the channel 104 and extending into or disposed within the interior space 147 defined by the EMI shielding/electrical grounding member 100.

In various embodiments, the EMI shielding/electrical grounding member 100 may be used for electrical grounding purposes by electrically contacting another surface that would bear against the finger element 108, for example, with a force having a component perpendicular to a longitudinal axis of the EMI shielding/electrical grounding member 100. In use, the finger element 108 (e.g., portion or contact face 144, etc.) may be borne against by another surface (e.g., portion of a blade server, etc.) thus causing the finger element 108 to move or flex generally inwardly towards the substrate. When the loading surface is removed from being in contact with finger element 108 (e.g., after the blade server is slidably removed away from the substrate, etc.), the resilient nature of the material out of which the EMI shielding/electrical grounding member 100 and/or finger element 108 are preferably constructed allows the finger element 108 to return to the unloaded position (shown in FIGS. 1 through 7). The material from which the EMI shielding/electrical grounding member 100 is constructed may be selected so that during use of the EMI shielding/electrical grounding member 100, the yield point of the material is not reached and no plastic deformation of the material occurs.

Alternative embodiments may, for example, include less or more slots and finger elements than what is shown in the figures. Further embodiments may include other slot arrangements and orientations besides transversely extending slots as shown in the figures.

Figure 3:
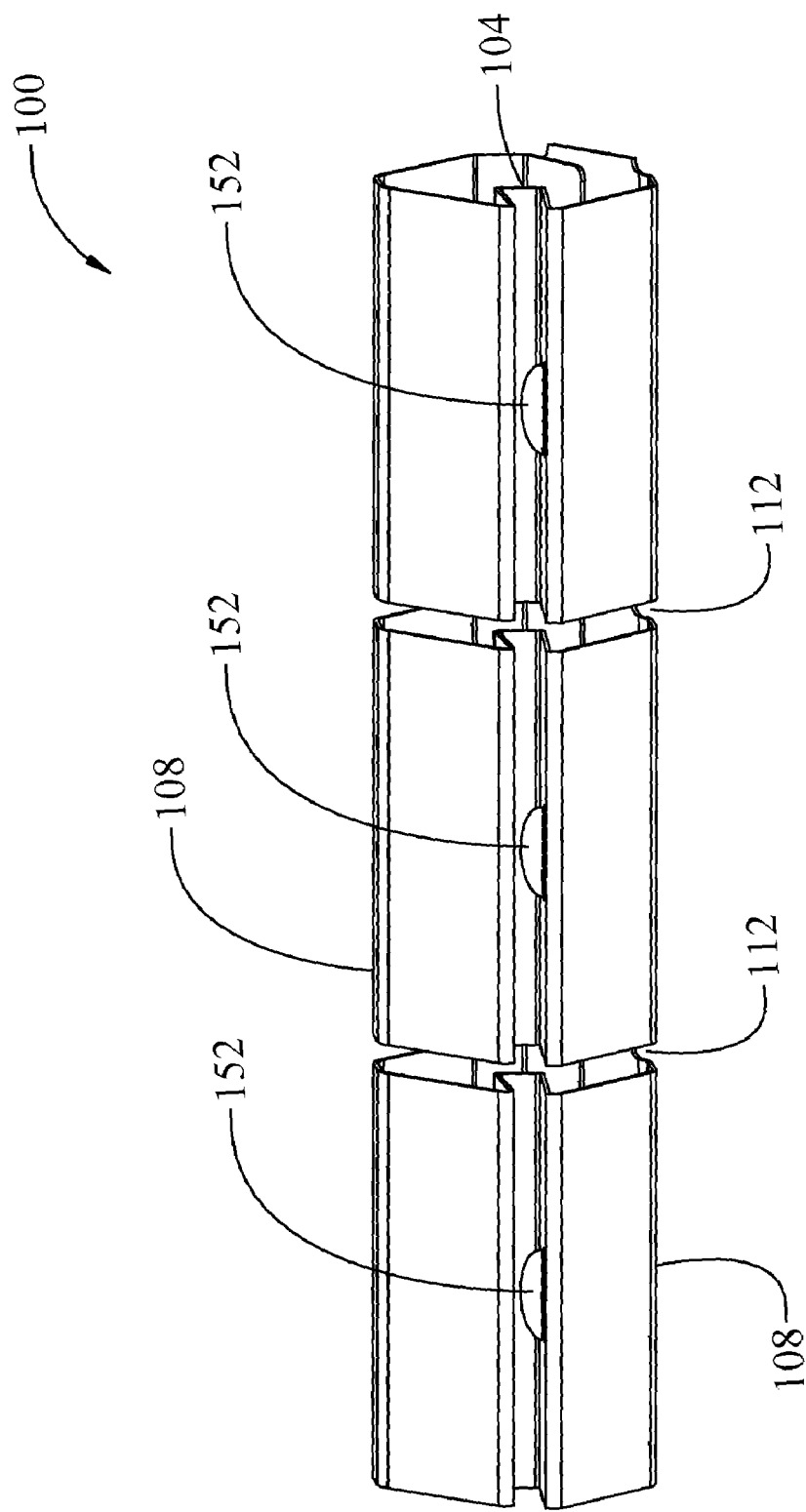
FIG. 3 is another perspective view of the EMI shielding/electrical grounding member shown in FIG. 1.
Figure 4:
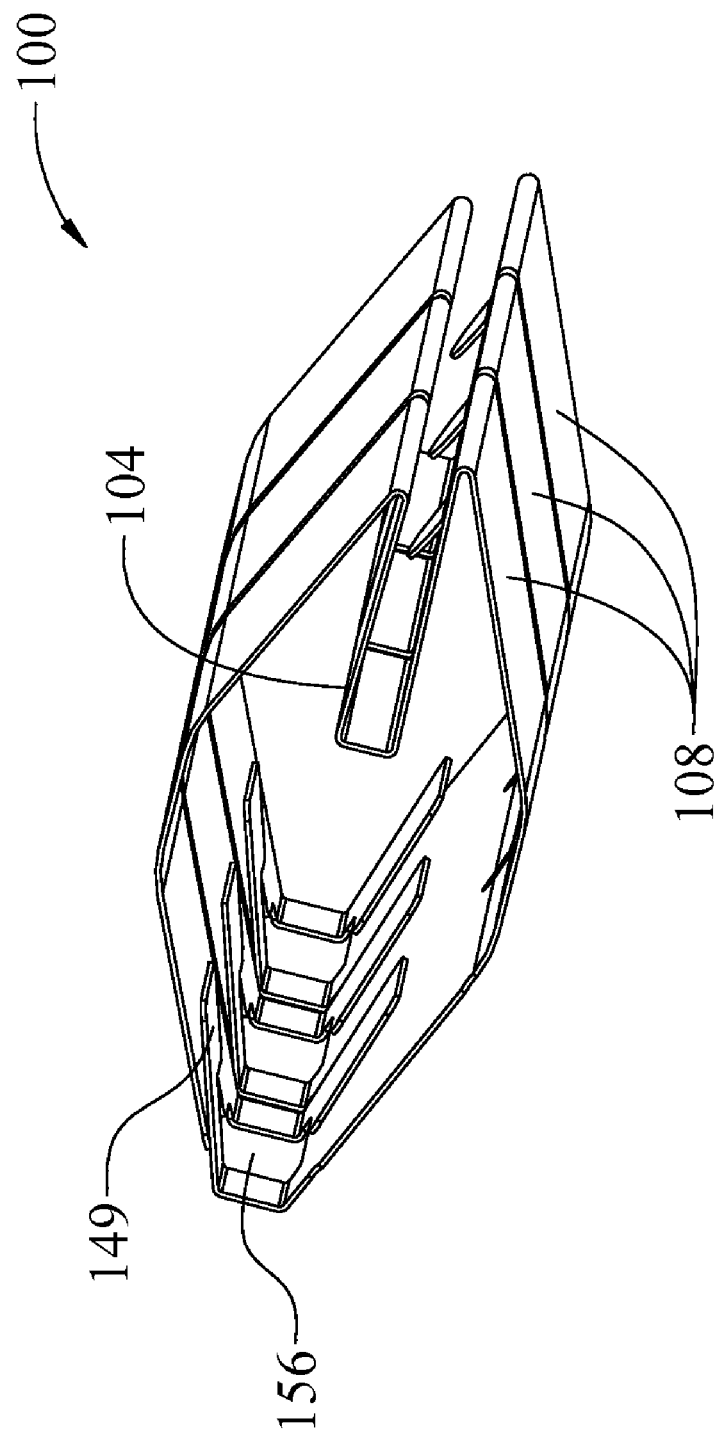
FIG. 4 is another perspective view of the EMI shielding/electrical grounding member shown in FIG. 1.
Figure 5:
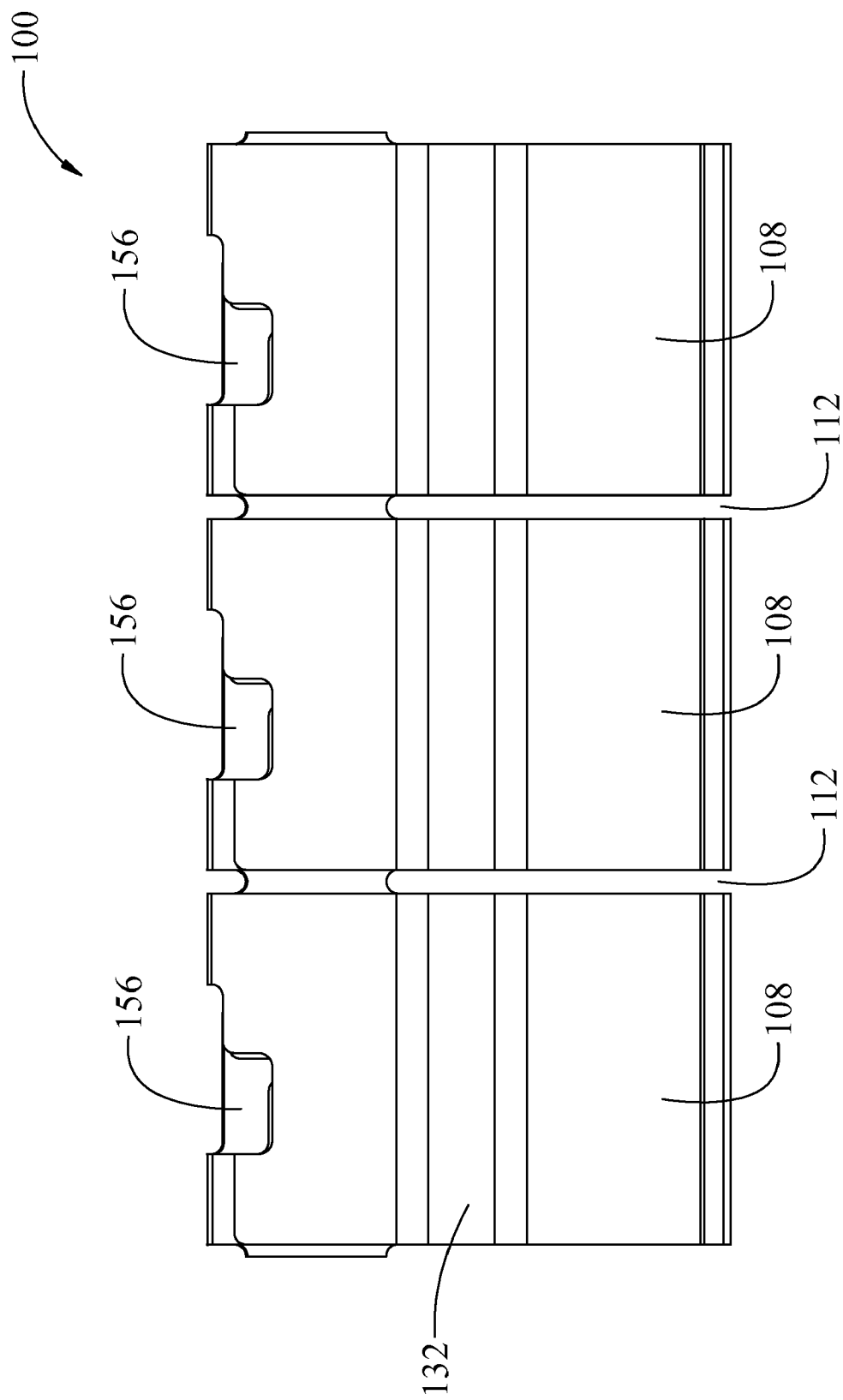
FIG. 5 is a side elevation view of the EMI shielding/electrical grounding member shown in FIG. 1.
Figure 6:
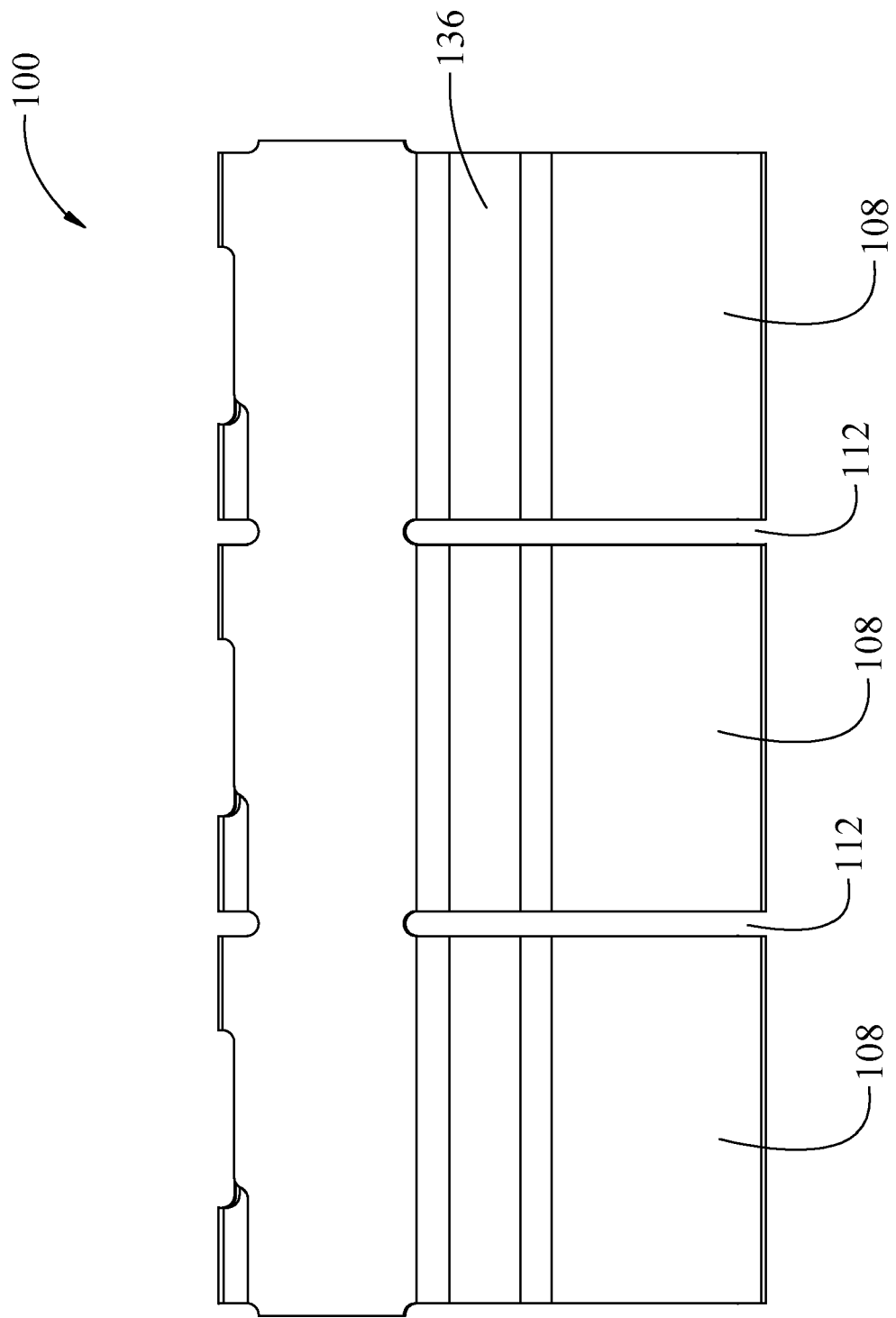
FIG. 6 is an elevation view illustrating the opposite side of the EMI shielding/electrical grounding member as compared to the side shown in FIG. 5.

As shown in FIGS. 3 and 7, the EMI shielding/electrical grounding member 100 also includes generally D-shaped lance features 152. In use, the D-shaped lance features 152 may help hold the EMI shielding/electrical grounding member 100 in place, for example, after the EMI shielding/electrical grounding member 100 has been installed to a substrate. In some exemplary installations, the D-shaped lance features 152 may be snapped into or engagingly received within openings 172 (FIG. 10), (such as drilled or punched holes, etc.) of a part or other mounting surface to create a very strong grip with excellent electrical conductivity. In other exemplary installations, the D-shaped lance features 152 may abut against a solid surface portion of a mounting surface. In either case, the D-shaped lance features 152 can thus provide a relatively secure mechanical attachment that inhibits the EMI shielding/electrical grounding member 100 from inadvertently falling out. Alternative embodiments may include additional or other means besides D-shaped lance features 152 to facilitate holding the EMI shielding/electrical grounding member 100 in place after it has been installed. For example, other embodiments may include T-shaped lances, ribs, protrusions, etc.

Figure 11:
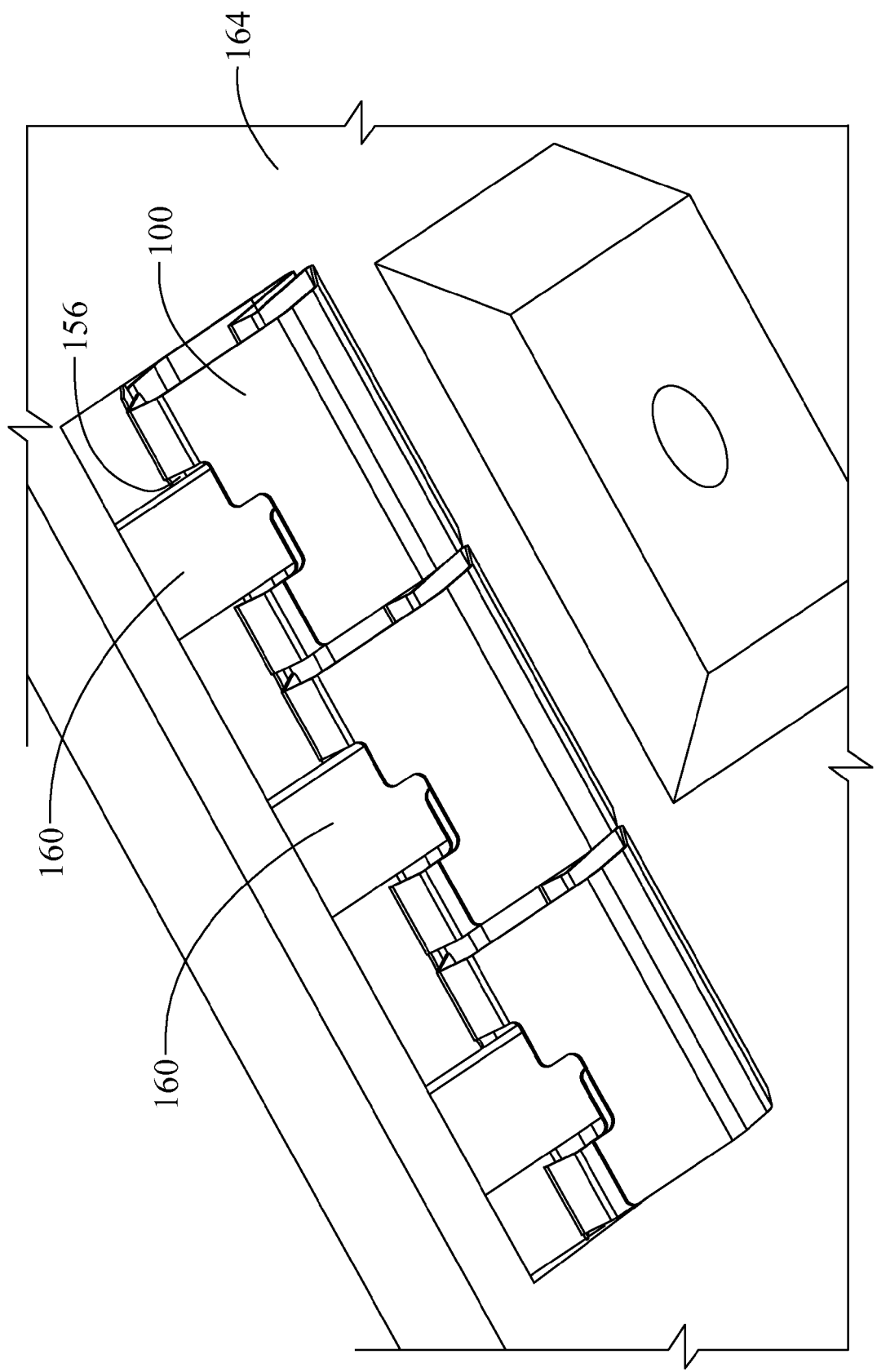
FIG. 11 is another view illustrating the EMI shielding/electrical grounding member installed on the sheet metal structure shown in FIG. 10.

With reference now to FIGS. 1 and 11, the EMI shielding/electrical grounding member 100 includes openings 156 (FIG. 1) for engagingly receiving corresponding portions 160 (e.g., projections, protuberances, elongate members, tangs, tongues, prongs, etc.) of the substrate 164 (FIG. 11). The engagement of the portions 160 within the openings 156 may thus help mechanically retain the EMI shielding/electrical grounding member 100 to the substrate 164, and also help establish electrical conductivity therebetween.

Figure 8:
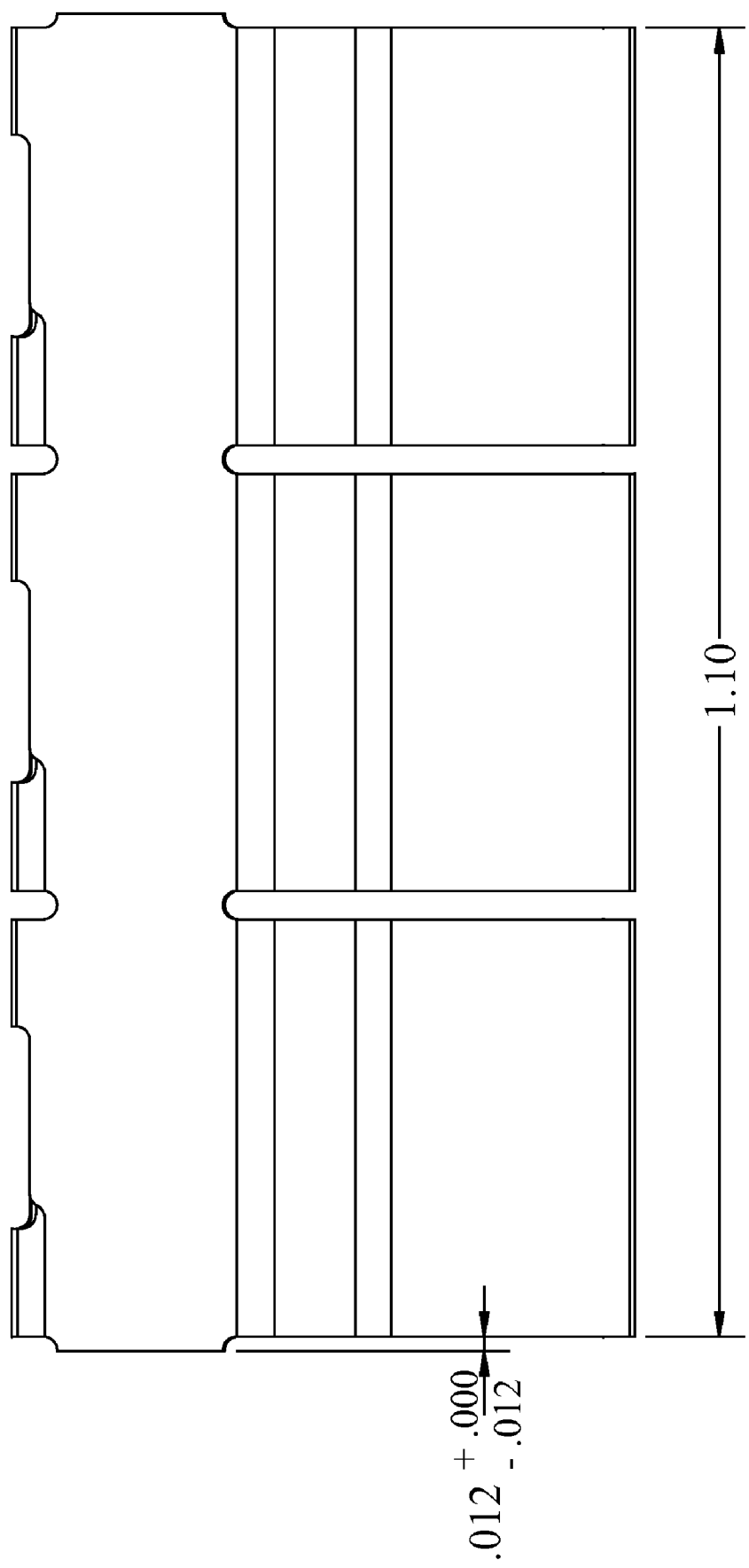
FIG. 8 is a side elevation view of the EMI shielding/electrical grounding member shown in FIG. 1 with exemplary dimensions provided for purposes of illustration only according to an exemplary embodiment.
Figure 9B:
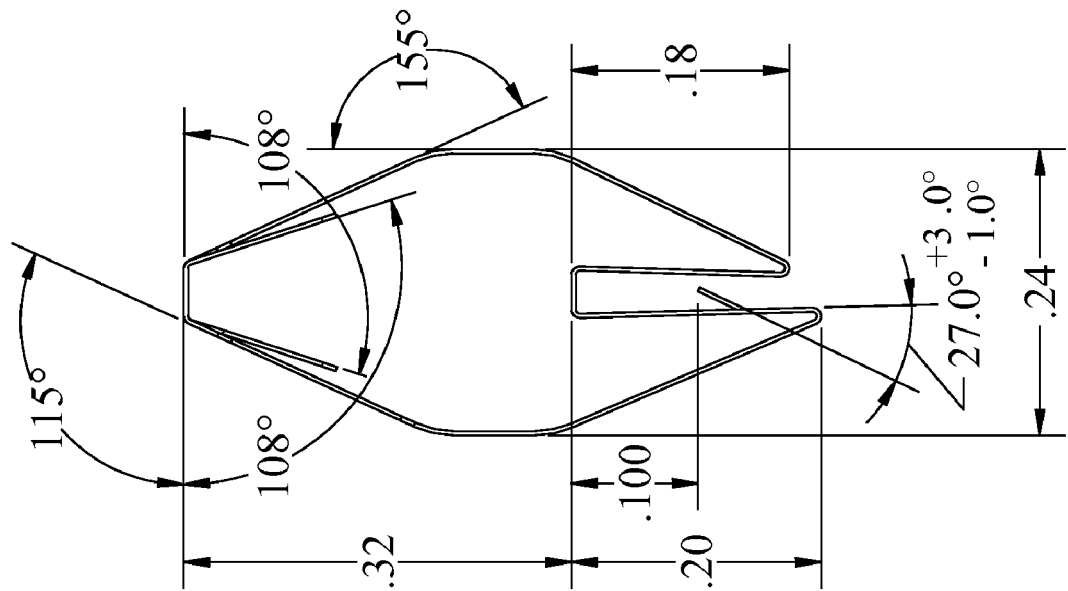
FIGS. 9A and 9B are end elevation views of the EMI shielding/electrical grounding member shown in FIG. 1 with exemplary dimensions provided for purposes of illustration only according to an exemplary embodiment.
Figure 9A:
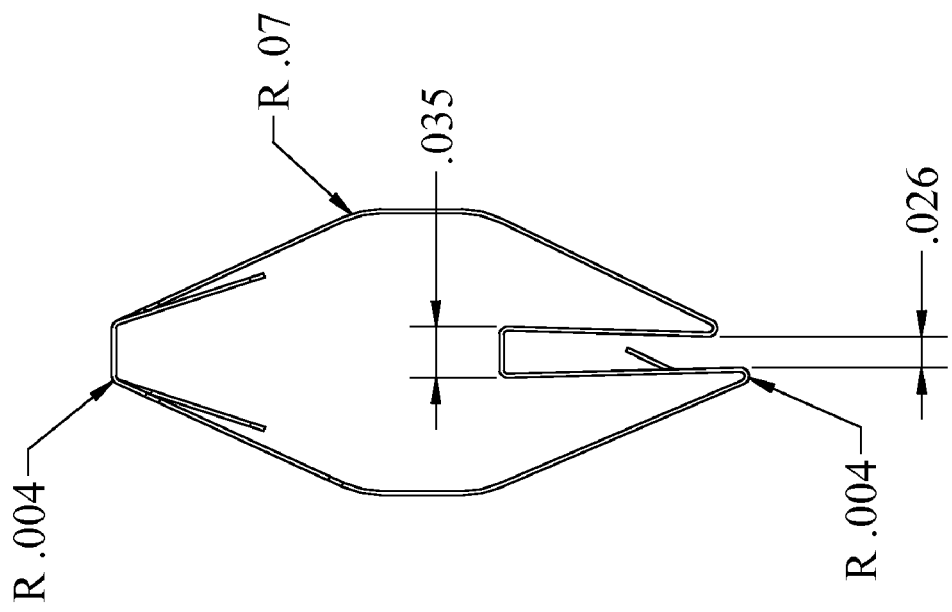

FIGS. 8 and 9 illustrate exemplary dimensions in inches that may be used for the EMI shielding/electrical grounding member 100 shown in FIGS. 1 through 7. These dimensions are provided solely for purposes of illustration and not for purposes of limitation. In the particular embodiment illustrated in FIGS. 8 through 9, the EMI shielding/electrical grounding member 100 may have the dimensions shown therein with a tolerance of +/−0.015 inch for dimensions shown to two decimal places, a tolerance of +/−0.005 inches for dimensions shown to three decimal places, and angular tolerances of +/−2 degrees. These dimensions (as are all dimensions set forth herein) are for purposes of illustration only as the specific dimensions for a particular application may depend, for example, upon the material properties of the EMI shielding/electrical grounding member and particular installation (e.g., thickness of the mounting surface, substrate edge, etc.) on which the EMI shielding/electrical grounding member will be positioned, etc. The dimensions of the EMI shielding/electrical grounding member may be varied in order to tailor the EMI shielding/electrical grounding member for a particular application.

In various embodiments, the EMI shielding/electrical grounding member 100 may be integrally or monolithically formed as a unitary component. In such embodiments, the EMI shielding/electrical grounding member 100 may comprise a unitary metal part stamped from a flat strip of sheet metal, which is then bent or formed into the configuration shown in FIGS. 1 through 7. In some embodiments, the EMI shielding/electrical grounding member 100 may be manufactured through a continuous process involving stamping and bending of sheet metal strips. Other embodiments may include one or more portions as discrete components (e.g., D-lance shaped features, etc.) that are separately attached to the EMI shielding/electrical grounding member 100, for example, by welding, adhesives, among other suitable methods. Alternative configurations (e.g., shapes, sizes, etc.), materials, and manufacturing methods may be used for making the EMI shielding/electrical grounding member 100.

A wide range of materials, preferably resiliently flexible and electrically conductive, may be used for an EMI shielding/electrical grounding member (e.g., 100, etc.) disclosed herein. In various embodiments, the EMI shielding/electrical grounding member is formed from resiliently flexible material that is elastic in nature with a modulus of elasticity sufficient so that the channel's wall portions and/or the finger elements may be displaced by a force from an unloaded position to a loaded position, and then return to the unloaded position upon the removal of this force without exceeding the yield point of the material. Additionally, or alternatively, the EMI shielding/electrical grounding member in some embodiments is formed from an electrically-conductive material capable of conducting electricity therethrough with impedance sufficiently low enough for electromagnetic interference/radio frequency interference (EMI/RFI) shielding applications.

By way of further example, some embodiments include an EMI shielding/electrical grounding member formed from beryllium copper alloy (e.g., beryllium copper alloy #25¼ hard having a thickness of 0.0035 inches thick, etc.). The beryllium copper alloy may include between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28% IACS (International Annealed Copper Standard). An example of a suitable alloy is available from Brush Wellman, Cleveland, Ohio, as Brush Alloy 25 (copper alloy UNS number C17200). Other suitable materials may also be used, such as phosphor bronze, copper-clad steel, brass, monel, aluminum, steel, nickel silver, other beryllium copper alloys, among others. Furthermore, the material can optionally be pre-plated or post-plated for galvanic compatibility with the surface on which it is intended to be mounted. Alternatively, the material can be a molded or cast polymer that is loaded or coated to be electrically-conductive.

In one particular embodiment, the EMI shielding/electrical grounding member 100 is formed from beryllium copper alloy #25 ¼ hard having an initial thickness of 0.0035 inches, and which has undergone heat treating such that the diamond-pyramid hardness number (DPH) is about 353 or more using a 500 gram load. The beryllium copper alloy may be cleaned, and provided with a finish for galvanic compatibility (e.g., bright tin finish, etc.).

As noted above, one example installation for the EMI shielding/electrical grounding member 100 is in conjunction with self-contained computer servers, also commonly referred to as blade servers. In such applications, an EMI shielding/electrical grounding member 100 may be installed onto a substrate (e.g., 164, etc.) for establishing electrical grounding contact between the substrate and two blade servers. Alternative installations are also possible for the EMI shielding/electrical grounding member 100.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An EMI shielding/electrical grounding member configured to be installed to a substrate for interposition generally between first and second spaced-apart electrically-conductive surfaces along opposite sides of and parallel to the substrate, for establishing electrical grounding contact from the substrate to the first and second electrically-conductive surfaces, the EMI shielding/electrical grounding member comprising:

first and second generally opposing sides hingedly connected and having respective first and second contact faces configured such that the first and second contact faces are each relatively independently operable and freely compressible upon contact with the respective first and second electrically-conductive surfaces, regardless of whether the other of said first and second contact faces is in contact with the corresponding first or second electrically-conductive surface; and at least one channel configured to engagingly receive an edge portion of the substrate, such that electrical contact is established between the EMI shielding/electrical grounding member and the substrate.

2. The EMI shielding/electrical grounding member of claim 1, wherein the EMI shielding/electrical grounding member is configured such that:

contact between the first contact face and the first electrically-conductive surface applies pressure for causing the first contact face to compressively move generally inwardly towards the substrate, against a force resiliently biasing the first contact face in a generally outward direction from the substrate towards the first electrically-conductive surface; and contact between the second contact face and the second electrically-conductive surface applies pressure for causing the second contact face to compressively move generally inwardly towards the substrate, against a force resiliently biasing the second contact face in a generally outward direction from the substrate towards the second electrically-conductive surface.

3. The EMI shielding/electrical grounding member of claim 1, further comprising:

a generally longitudinally extending region;

one or more slots extending generally transversely along the generally longitudinally extending region; and one or more resiliently flexible finger elements including at least a portion defined by the slots along the first and second sides, the first and second contact faces being defined by the corresponding resiliently flexible finger elements along the respective first and second sides.

4. The EMI shielding/electrical grounding member of claim 3, wherein the one or more resiliently flexible finger elements are configured to flex relatively independently from one another upon contact with the respective first and second electrically-conductive surfaces, regardless of whether the other resiliently flexible finger elements are in contact with the corresponding first or second electrically-conductive surface.

5. The EMI shielding/electrical grounding member of claim 3, wherein the EMI shielding/electrical grounding member is configured such that:

contact between the one or more resiliently flexible finger elements along the first side and the first electrically-conductive surface applies pressure for causing the one or more resiliently flexible finger elements along the first side to compressively move generally inwardly towards the substrate, against a force resiliently biasing the one or more resiliently flexible finger elements along the first side in a generally outward direction from the substrate towards the first electrically-conductive surface; and contact between the one or more resiliently flexible finger elements along the second side and the second electrically-conductive surface applies pressure for causing the one or more resiliently flexible finger elements along the second side to compressively move generally inwardly towards the substrate, against a force resiliently biasing the one or more resiliently flexible finger elements along the second side in a generally outward direction from the substrate towards the second electrically-conductive surface.

6. The EMI shielding/electrical grounding member of claim 3, wherein the one or more resiliently flexible finger elements are configured to be compressed generally between the substrate and the corresponding first or second electrically-conductive surface to provide a contact pressure for establishing electrical conductivity between the substrate and the corresponding first or second electrically-conductive surface that is sufficient for EMI shielding applications.

7. The EMI shielding/electrical grounding member of claim 1, wherein the first and second sides include overlapping end portions disposed within the interior space defined by the EMI shielding/electrical grounding member.

8. The EMI shielding/electrical grounding member of claim 1, wherein the channel is configured to frictionally receive the edge portion of the substrate therein for helping mechanically retain the EMI shielding/electrical grounding member to the substrate and establish electrical contact with the substrate.

9. The EMI shielding/electrical grounding member of claim 1, further comprising one or more D-shaped lance features within the channel configured for helping mechanically retain the EMI shielding/electrical grounding member to the substrate.

10. The EMI shielding/electrical grounding member of claim 9, wherein at least one of the one or more D-shaped lance features is configured to be engagingly received within a corresponding opening defined by the substrate.

11. The EMI shielding/electrical grounding member of claim 1, further comprising one or more openings defined generally between the first and second sides generally opposite the channel, and wherein the one or more openings are configured for engagingly receiving corresponding one or more projecting portions of the substrate, for helping mechanically retain the EMI shielding/electrical grounding member to the substrate.

12. The EMI shielding/electrical grounding member of claim 1, wherein:

the channel includes first and second generally opposing sidewall portions connected by a third wall portion;

the first, second, and third wall portions inwardly spaced-apart from the first and second sides and within an interior space generally between the first and second sides; and the first, second, and third wall portions cooperatively define a generally inverted U-shaped transverse profile for the channel.

13. The EMI shielding/electrical grounding member of claim 12, wherein:

the first and second sidewall portions are configured to frictionally grip the portion of the substrate within the channel, for inhibiting inadvertent removal of the EMI shielding/electrical grounding member from the substrate and for creating sufficient contact pressure between the EMI shielding/electrical grounding member and the substrate to establish electrical conductivity therebetween.

14. The EMI shielding/electrical grounding member of claim 1, wherein the first and second sides are formed from a resiliently flexible material and configured so to inhibit snagging with the corresponding first or second electrically-conductive surfaces while sliding relative to the EMI shielding/electrical grounding member.

15. The EMI shielding/electrical grounding member of claim 1, wherein the first and second sides are configured so as to flex generally towards the substrate when a sufficient load is applied to the corresponding first and second contact faces as the corresponding first or second electrically-conductive surface is slidably moved relative to the substrate in contact with the corresponding first and second contact faces.

16. The EMI shielding/electrical grounding member of claim 1, wherein the EMI shielding/electrical grounding member is installed on and in electrical contact with a substrate generally between first and second blade servers that respectively define the first and second electrically-conductive surfaces such that the first and second electrically-conductive surfaces are parallel to the substrate, and wherein the EMI shielding/electrical grounding member provides electrical conductivity between the substrate and first and second electrically-conductive surfaces of the respective first and second blade servers.

17. The EMI shielding/electrical grounding member of claim 3, wherein the one or more resiliently flexible finger elements are resiliently flexible such that the one or more resiliently flexible finger elements flex generally inwardly towards the substrate when contacted by another surface bearing against the one or more resiliently flexible finger elements with a force having a component generally perpendicular to a longitudinal axis of the EMI shielding/electrical grounding member.

18. The EMI shielding/electrical grounding member of claim 1, wherein the first and second sides include:
a first slanted portion;
a generally flat portion extending from the first slanted portion such that an obtuse angle is defined generally between the first slanted portion and the generally flat portion; and
a second slanted portion extending generally from the generally flat portion such that an obtuse angle is defined generally between the second slanted portion and the generally flat portion.

19. The EMI shielding/electrical grounding member of claim 18, wherein the first slanted portions are operable as camming surfaces such that contact therewith by the corresponding first or second electrically-conductive surface causes the corresponding first or second side to compressively move generally inwardly towards the substrate.

20. The EMI shielding/electrical grounding member of claim 1, wherein the EMI shielding/electrical grounding member comprises a resilient flexible electrically-conductive material.

21. The EMI shielding/electrical grounding member of claim 1, wherein the EMI shielding/electrical grounding member is made entirely from a single blank of material.

22. An EMI shielding/electrical grounding member configured to be installed to a substrate for interposition generally between first and second electrically-conductive surfaces, for establishing electrical grounding contact from the substrate to the first and second electrically-conductive surfaces, the EMI shielding/electrical grounding member comprising:
a generally longitudinally extending region;
one or more slots extending generally transversely along the generally longitudinally extending region; and
first and second resiliently flexible finger elements each including at least a portion defined by the slots along respective first and second sides of the EMI shielding/electrical grounding member such that the first and second resiliently flexible finger elements are relatively independently operable and freely compressible upon contact with the respective first and second electrically-conductive surfaces, regardless of whether the other of said first and second resiliently flexible finger elements is in contact with the corresponding first or second electrically-conductive surface;
at least one channel within an interior space generally between the first and second resiliently flexible finger elements, the channel extending generally longitudinally along at least a portion of the generally longitudinally extending region, the channel configured to engagingly receive an edge portion of the substrate;
whereby contact between the first resiliently flexible finger element and the first electrically-conductive surface may apply sufficient pressure for causing the first resiliently flexible finger element to compressively flex generally inwardly towards the substrate, against a force resiliently biasing the first resiliently flexible finger element in a generally outward direction from the substrate towards the first electrically-conductive surface; and
whereby contact between the second resiliently flexible finger element and the second electrically-conductive surface may apply sufficient pressure for causing the second resiliently flexible finger element to compressively flex generally inwardly towards the substrate, against a force resiliently biasing the second resiliently flexible finger element in a generally outward direction from the substrate towards the second electrically-conductive surface.

23. The EMI shielding/electrical grounding member of claim 22, wherein the one or more slots comprise a plurality of slots extending generally transversely along the generally longitudinally extending region such that the first resiliently flexible finger element comprises a plurality of resiliently flexible finger elements along the first side, and such that the second resiliently flexible finger element comprises a plurality of resiliently flexible finger elements along the second side.

24. The EMI shielding/electrical grounding member of claim 22, wherein the first and second resiliently flexible finger elements include:
a first slanted portion;
a generally flat portion extending from the first slanted portion such that an obtuse angle is defined generally between the first slanted portion and the generally flat portion; and
a second slanted portion extending generally from the generally flat portion such that an obtuse angle is defined generally between the second slanted portion and the generally flat portion.

25. A method for establishing electrical grounding contact from a substrate to first and second electrically-conductive surfaces, the method comprising:
installing an EMI shielding/electrical grounding member to the substrate such that generally opposing first and second sides of the EMI shielding/electrical grounding member are positioned for making electrical grounding contact with the respective first and second electrically-conductive surfaces and such that an edge portion of the substrate is received within at least one channel of the EMI shielding/electrical grounding member whereby electrical contact is established between the EMI shielding/electrical grounding member and the substrate, the first and second sides of the EMI shielding/electrical grounding member being hingedly connected and having respective first and second contact faces configured such that the first and second contact faces are each relatively independently operable and freely compressible upon contact with the respective first and second electrically-conductive surfaces, regardless of whether the other of said first and second contact faces is in contact with the corresponding first or second electrically-conductive surface.

26. The method of claim 25, wherein the EMI shielding/electrical grounding member is installed on and in electrical contact with the substrate generally between first and second blade servers that respectively define the first and second electrically-conductive surfaces such that the first and second electrically-conductive surfaces are parallel to the substrate, and wherein the EMI shielding/electrical grounding member provides electrical conductivity between the substrate and first and second electrically-conductive surfaces of the respective first and second blade servers.

27. The method of claim 26, further comprising sliding the first blade server relative to the substrate such that the electrically-conductive surface of the first blade server electrically contacts the first side of the EMI shielding/electrical grounding member, thereby establishing electrical grounding contact from the substrate to the first blade server.

28. The method of claim 27, wherein:
the first side is caused to compressively flex generally inwardly towards the substrate by pressure applied by sliding of the first blade server in a first direction; and
the first side is allowed to flex outwardly away from the substrate upon removal of the pressure applied by the first blade server when slidably moved relative to the substrate in a second direction opposite the first direction.

* * * * *